US006023825A

United States Patent [19]

Ando et al.

[11] Patent Number: 6,023,825

[45] Date of Patent: Feb. 15, 2000

[54] METHOD OF MANUFACTURING AN INK JET HEAD

[75] Inventors: Hirokazu Ando; Mitsuru Kishimoto; Noboru Ooishi; Masahiko Shimosugi; Isao Shibata, all of Tokyo, Japan

[73] Assignees: Oki Electric Industry Co., Ltd.; Oki Data Corporation, both of Tokyo, Japan

[21] Appl. No.: 09/154,808

[22] Filed: Sep. 17, 1998

Related U.S. Application Data

[62] Division of application No. 08/544,705, Oct. 18, 1995, Pat. No. 5,844,587.

[30] Foreign Application Priority Data

Oct. 20, 1994 [JP] Japan .................................... 6-255477

[51] Int. Cl.[7] .................................................... H01L 41/22

[52] U.S. Cl. ............................... 29/25.35; 347/69; 347/71

[58] Field of Search ................................ 29/25.35, 890.1; 347/68, 69, 71, 72; 310/366

[56] References Cited

U.S. PATENT DOCUMENTS

| | | | |
|---|---|---|---|
| 4,584,590 | 4/1986 | Fischbeck et al. | 347/69 |
| 4,695,854 | 9/1987 | Cruz-Uribe . | |
| 4,887,100 | 12/1989 | Michaelis et al. | 347/69 |
| 5,136,365 | 8/1992 | Pennisi et al. | 257/783 |
| 5,227,813 | 7/1993 | Pies et al. . | |
| 5,235,352 | 8/1993 | Pies et al. . | |

FOREIGN PATENT DOCUMENTS

| | | | |
|---|---|---|---|
| 0 528 648 A1 | 2/1993 | European Pat. Off. . | |
| 6159914 | 8/1978 | Japan . | |
| 61-130059 | 11/1986 | Japan . | |
| 4-099644 | 3/1992 | Japan | 347/68 |
| 4-345858 | 4/1993 | Japan . | |
| 6183014 | 10/1994 | Japan . | |
| WO 93/19940 | 10/1993 | WIPO . | |
| WO 94/15791 | 7/1994 | WIPO . | |

*Primary Examiner*—Carl E. Hall
*Attorney, Agent, or Firm*—Rabin & Champagne, PC

[57] ABSTRACT

An ink-jet head comprising a plurality of sidewalls each imparting a pressure pulse to an ink pressurizing cell by means of shear mode deformation, and a front wall having a plurality of orifices. The ink in the ink pressurizing cells is ejected from the orifices. Each sidewall comprises a first wall section, a first electrode disposed thereon, an anisotropic adhesive disposed thereon, a second electrode disposed thereon, and a second wall section disposed thereon. Width of the first electrode is narrower than width of the first wall section, and the upper surface of the first wall section has first side areas which are not covered by the first electrode. Width of the second electrode is narrower than width of the second wall section, and the lower surface of the second wall section has second side areas which are not covered by the second electrode. The anisotropic adhesive has conductivity only in a direction perpendicular to the upper surface of the first wall section and the lower surface of the second wall section, and the anisotropic adhesive covers the first and second electrodes so that the first and second electrodes are not exposed to the ink in the ink pressurizing cells.

4 Claims, 7 Drawing Sheets

METHOD OF MANUFACTURING AN INK JET HEAD

This is a Division of application Ser. No. 08/544,705, filed Oct. 18, 1995 now U.S. Pat. No. 5,844,587.

BACKGROUND OF THE INVENTION

The present invention relates to an ink-jet head for ejecting ink droplets from each ink pressurizing cell for imparting a pressure pulse to the ink pressurizing cell and, more particularly, a sidewall of the ink pressurizing cell for imparting a pressure pulse jto the ink pressurizing cell by means of shear mode deformation. The present invention also relates to a manufacturing method of the ink-jet head.

In general, conventional ink-jet heads used in ink-jet recording devices utilized thermal jet systems whereby air bubbles were generated in the ink pressurizing cells by heating elements to thereby pressurize the ink in the ink pressurizing cells (refer to Japanese Patent Kokoku Publication No. 59914/1986). However, in this case, since the ink is heated by the heating elements, the ink is impaired by the heat and printing quality is reduced. Also, since air bubble generation cannot be stabilized, clogging of the orifices occurs, air bubbles enter an ink flow path, and thermal stress produces cracks in the composing parts of the ink-jet head.

An alternative ink-jet head utilizing piezoelectric material is disclosed in, for example, U.S. Pat. No. 5,227,813 and 5,235,352. FIG. 1 shows a cross-sectional view of a main part of the ink-jet head disclosed in the above-mentioned publications. As shown in FIG. 1, the ink-jet head comprises a plurality of ink pressurizing cells or channels 14*a,* 14*b,* . . . defined by a bottom part 1, sidewalls 2, a top part 3 and a front wall having a plurality of orifices 15*a,* 15*b,* . . .

The bottom part 1 is formed from a lower part of a piezoelectric material base 11 polarized in an array direction P.

Each sidewall 2 comprises a projecting wall section 11*a* (or 11*b,* . . . ) which is composed of an upper part of a piezoelectric material base 11, and an intermediate wall section 12*a* (or 12*b,* . . . ) made from piezoelectric material polarized in the same direction P as that of the piezoelectric material base 11 and disposed on the projecting wall section 11*a* (or 11*b,* . . . ). Electrodes 16*a,* 16*b,* . . . are respectively formed at the ends of the projecting wall sections 11*a,* 11*b,* . . . Electrodes 17*a,* 17*b,* . . . and electrodes 18*a,* 18*b,* . . . are formed at the respective ends of the intermediate wall sections 12*a,* 12*b,* . . . Conductive adhesives 20*a,* 20*b,* . . . are disposed between the electrodes 16*a,* 16*b,* . . . and the electrodes 17*a,* 17*b,* . . . The intermediate wall sections 12*a,* 12*b,* . . . are secured to the projecting wall sections 11*a,* 11*b,* . . . of the piezoelectric material base 11 by the conductive adhesive 20*a,* 20*b,* . . .

The top part 3 comprises a top plate 13 and a common electrode 19 formed on a lower surface of the top plate 13. Conductive adhesives 21*a,* 21*b,* . . . are disposed between the common electrode 19 and the electrodes 18*a,* 18*b,* . . . of the intermediate wall sections 12*a,* 12*b,* . . . The top plate 13 is secured to the intermediate wall sections 12*a,* 12*b,* . . . by the conductive adhesive 21*a,* 21*b,* . . .

When the common electrode 19 is grounded, a positive voltage +V is applied to the electrode 16*a* and a negative voltage −V is applied to the electrode 16*b,* an electric field is generated through the piezoelectric element base 11 from the projecting wall section 11*a* to the projecting wall section 11*b* in the direction shown by a broken line A. Also, an electric field is generated in the intermediate wall section 12*b* from the electrode 17*a* toward the common electrode 19 in the direction shown by a broken line B. Also, an electric field is generated in the intermediate wall section 12*b* from the common electrode 19 toward the electrode 17*b* in the direction shown by a broken line C. As a result, shear mode deformation (shown by broken lines 60 in FIG. 1) is generated in respectively opposite directions in the projecting wall sections 11*a,* 11*b* and the intermediate wall section 12*a,* 12*b.* The ink in the ink pressurizing cell 14*a* is then pressurized, and ink droplets are ejected from the orifice 15*a.*

In this case, leak current in the direction D flows in the ink pressurizing cell 14*a* from the electrode 20*a* to the electrode 20*b,* the amount of pressurization in the ink pressurizing cell 14*a* by shear mode deformation is reduced, and an adequate amount of ink droplets cannot be ejected from the orifice 15*a.* In addition, electrochemical reaction caused by the leak current produces corrosion in the electrodes 16*a,* 16*b* and 17*a,* 17*b* and the ink quality can be impaired.

As indicated by the double dotted line in the ink pressurizing cell 14*b,* a method can be considered whereby parts of the piezoelectric material base 11 and the intermediate wall sections 12*b,* 12*c* contacting the ink are covered with an insulated coating layer 24, thereby insulating an interior of the ink pressurizing cell 14*b* from the electrodes 16*b,* 16*c* and 17*b,* 17*c.*

However, the width of the ink pressurizing cell is set very narrow at 30–100 [$\mu$m], making uniform and complete covering by the insulated coating layer 24 difficult. Also, since burrs are easily produced in the end faces of the electrodes 16*b,* 16*c* and 17*b,* 17*c* when forming the grooves (ink pressurizing cells), pinholes are produced in the insulated coating layer 24, preventing insulation of the ink pressurizing cell 14*b* from the electrodes 16*b,* 16*c* and 17*b,* 17*c.*

SUMMARY OF THE INVENTION

An object of the present invention is to provide an ink-jet head and a manufacturing method thereof to enable an adequate amount of ink droplets to be ejected from the orifices.

According to one aspect of the present invention, an ink-jet head comprises: a plurality of ink pressurizing cells (14*a*), each containing ink; a plurality of sidewalls (2, 4) each forming a longitudinal wall of the ink pressurizing cell (14*a*) and each imparting a pressure pulse to the ink pressurizing cell (14*a*) by means of shear mode deformation of the sidewalls (2, 4); a bottom wall (1) forming a lateral wall of the plurality of ink pressurizing cells (14*a*); a top wall (13, 5) forming a lateral wall of the plurality of ink pressurizing cells (14*a*); and a front wall (15) forming a longitudinal wall of the ink pressurizing cells (14*a*) and having a plurality of orifices (15*a*) each of which passes through the front wall (15), the ink in the ink pressurizing cells (14*a*) being ejected from the orifices (15*a*) when the pressure pulse is imparted to the ink pressurizing cell (14*a*). Each of the sidewalls (2, 4) comprises: a first wall section (11*a*) made from piezoelectric material; a first electrode (16*a*) disposed on an upper surface of the first wall section (11*a*), width ($L_1$) of the first electrode being narrower than width ($L_2$) of the first wall section (11*a*), and the upper surface of the first wall section (11*a*) having a first side area ($E_1$) which is not covered by the first electrode (16*a*); an anisotropic adhesive (31) disposed on the first electrode (16*a*) and the first side area ($E_1$) of the first wall section (11*a*); a second electrode (17*a,* 52*a*) disposed on the anisotropic adhesive (31); and a second wall section (12*a,* 51*a*) made from piezoelectric material and disposed on the second electrode (17*a,* 52*a*), width ($L_1$) of the second electrode (17*a,* 52*a*) being narrower than width ($L_2$) of the second wall section (12*a,* 51*a*), and the lower surface of the second wall section (12*a,* 51*a*) having a second side area ($E_2$) which is not covered by the second electrode (17*a,* 52*a*). The anisotropic adhesive (31) has conductivity only in a direction perpendicular to the upper surface of the first wall section (11*a*) and the lower surface of the second wall section (12*a,* 52*a*), and the anisotropic adhesive (31) covers the first and second electrodes (16*a,* 17*a,* 52*a*) so that the first and second electrodes (16*a,* 17*a,* 52*a*) are not exposed to the ink in the ink pressurizing cells (14*a*).

The second wall section (12*a,* 52*a*) is polarized in an array direction (P) in which the plurality of ink pressurizing cells (14*a,* 14*b*) are arranged. The first wall section (11*a*) is polarized in an array direction (P) in which the plurality of ink pressurizing cells (14*a,* 14*b*) are arranged.

Each sidewall (1) may comprise a third electrode (18*a*) disposed on an upper surface of the second wall section (12*a*); a common electrode (19) disposed on a lower surface of the top wall (13); and a conductive adhesive (21*a*) for bonding the third electrode (18*a*) with the common electrode (19).

The bottom wall (1) and the plurality of first wall sections (11*a,* 11*b*) forms an one-piece construction (11), and the top wall (51) is made from piezoelectric material, and the top wall (51) and the plurality of second wall sections (51*a,* 51*b*) forms an one-piece construction.

According to another aspect of the invention, each of the sidewalls (2) comprises: a first wall section (11*a*) made from piezoelectric material; a first electrode (16*a*) disposed on an upper surface of the first wall section (11*a*), width ($L_1$) of the first electrode being narrower than width ($L_2$) of the first wall section (11*a*), and the upper surface of the first wall section (11*a*) having a first side area ($E_1$) which is not covered by the first electrode (16*a*); an insulating adhesive (55) disposed on the first electrode (16*a*) and the first side area ($E_1$) on the upper surface of the first wall section (11*a*); a second electrode (17*a*) disposed on the insulating adhesive (55); a second wall section (12*a*) made from piezoelectric material and disposed on the second electrode (17*a*), width ($L_1$) of the second electrode (17*a*) being narrower than width ($L_2$) of the second wall section (12*a*), and the lower surface of the second wall section (12*a*) having a second side area ($E_2$) which is not covered by the second electrode (17*a*). The ink-jet head further comprises conductive members (56) disposed in an outside of the ink pressurizing cells (14*a*) and electrically connecting the first electrode (16*a*) with the second electrode (17*a*), and the insulating adhesive (55) covers the first and second electrodes (16*a,* 17*a*) so that the first and second electrodes (16*a,* 17*a*) are not exposed to the ink in the ink pressurizing cells (14*a*).

Further, a manufacturing method of an ink-jet head according to the present invention comprises the steps of: forming a plurality of stripe patterns of first electrodes (16*a,* 16*b*) at a predetermined intervals on an upper surface of a first piezoelectric material plate; forming a plurality of stripe-shaped second electrodes (17*a,* 17*b*) at predetermined intervals on a lower surface of a second piezoelectric material plate; forming a third electrode (18) on an upper surface of the second piezoelectric material plate; applying an anisotropic adhesive (31) to at least one of the upper surface of the first electrodes (16*a,* 16*b*) and the lower surface of the second electrodes (17*a,* 17*b*), the anisotropic adhesive (31) having conductivity only in a direction perpendicular to the upper surfaces of the first electrodes (16*a,* 16*b*) and the lower surfaces of the second electrodes (17*a,* 17*b*); placing the first piezoelectric material plate on the second piezoelectric material plate in such a way that the first electrodes (16*a,* 16*b*) and the second electrodes (17*a,* 17*b*) face each other across the anisotropic adhesive (31); cutting a plurality of grooves between the first electrodes (16*a,* 16*b*) as well as between the second electrodes (17*a,* 17*b*) to form a plurality of sidewalls (2) in such a way that the grooves penetrate through the third electrode (18), the second piezoelectric material plate and the anisotropic adhesive (31) and reach a middle of the first piezoelectric material plate and in such a way that width ($L_1$) of the first electrode (16*a,* 16*a*) and the second electrode (17*a,* 17*b*) are narrower than width ($L_2$) of the sidewall (2) and the first and second electrodes (16*a,* 16*b,* 17*a,* 17*b*) are covered by the anisotropic adhesive (31) not so as to be exposed to the ink in the ink pressurizing cells (14*a,* 14*b*); applying a conductive adhesive (21*a,* 21*b*) to an upper surface of the third electrode (18*a,* 18*b*); and placing a top plate (13) having a common electrode (19) on the conductive adhesive (21*a,* 21*b*) in such a way that the common electrode (19) faces the third electrode (18*a,* 18*b*) across the conductive adhesive (21*a,* 21*b*).

Another manufacturing method of an ink-jet head according to the present invention comprises the steps of: forming a plurality of stripe patterns of first electrodes (16*a,* 16*b*) at predetermined intervals on an upper surface of a first piezoelectric material plate; forming a plurality of stripe patterns of second electrodes (17*a,* 17*b*) at predetermined intervals on a lower surface of a second piezoelectric material plate; forming a third electrode (18) on an upper surface of the second piezoelectric material plate; applying an insulating adhesive (55) to at least one of the upper surface of the first electrodes (16*a,* 16*b*) and the lower surface of the second electrodes (17*a,* 17*b*); placing the first piezoelectric material plate on the second piezoelectric material plate in such a way that the first electrodes (16*a,* 16*b*) and the second electrodes (17*a,* 17*b*) face each other across the insulating adhesive (55); cutting a plurality of grooves between the first electrodes (16*a,* 16*b*) as well as between the second electrodes (17*a,* 17*b*) to form a plurality of sidewalls (2) in such a way that the grooves penetrate through the third electrode (18), the second piezoelectric material plate and the insulating adhesive (55) and reach a middle of the first piezoelectric material plate and in such a way that width ($L_1$) of the first electrode (16*a,* 16*a*) and the second electrode (17*a,* 17*b*) are narrower than width ($L_2$) of the sidewall (2) and the first and second electrodes (16*a,* 16*b,* 17*a,* 17*b*) are covered by the insulating adhesive (31) not so as to be exposed to the ink in the ink pressurizing cells (14*a,* 14*b*); applying a conductive adhesive (21*a,* 21*b*) to an upper surface of the third electrode (18*a,* 18*b*); placing a top plate (13) having a common electrode (19) on the conductive adhesive (21*a,* 21*b*) in such a way that the common electrode (19) faces the third electrode (18*a,* 18*b*) across the conductive adhesive (21*a,* 21*b*); and electrically connecting the first electrodes (16*a,* 16*b*) and the second electrodes (17*a,* 17*b*) in the same sidewall (2) by conductive wires.

BRIEF DESCRIPTION OF THE INVENTION

PREFERRED EMBODIMENTS OF THE INVENTION

Preferred embodiments of the present invention will be described with reference to the attached drawings.

First Embodiment

Figure 2:
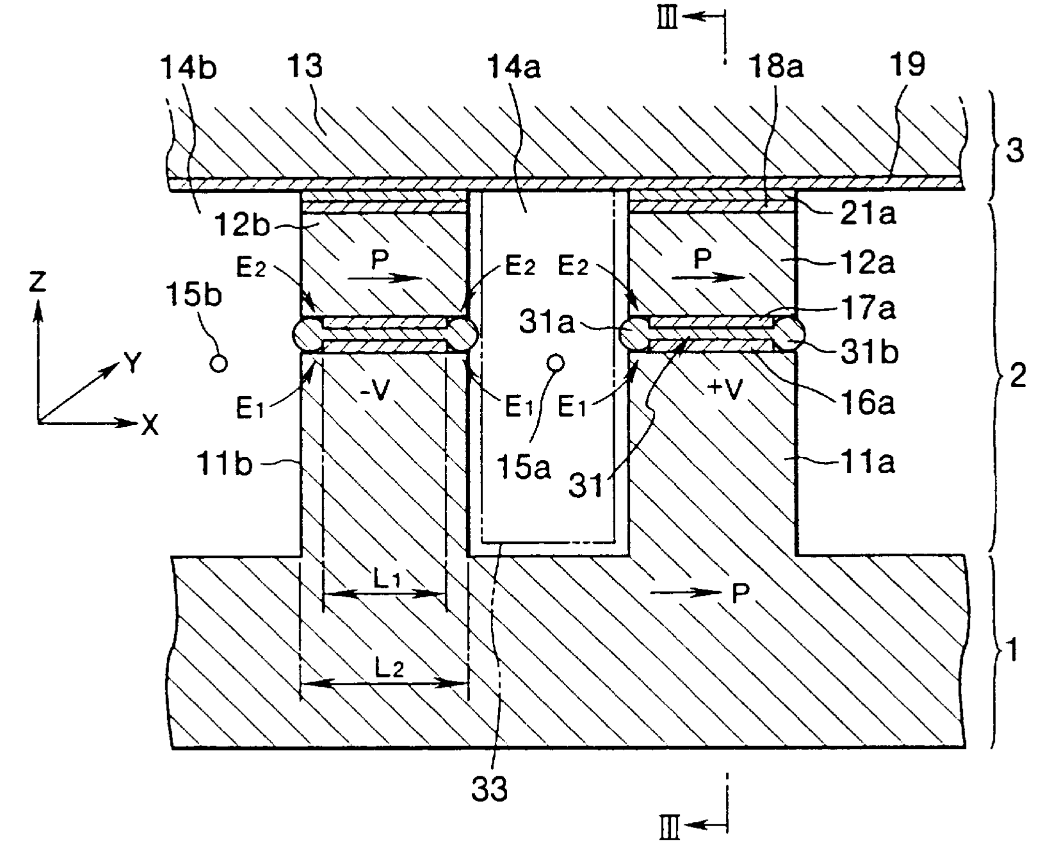
FIG. 2 is a cross-sectional view showing an essential part of an ink-jet head according to a first embodiment of the present invention.
Figure 3:
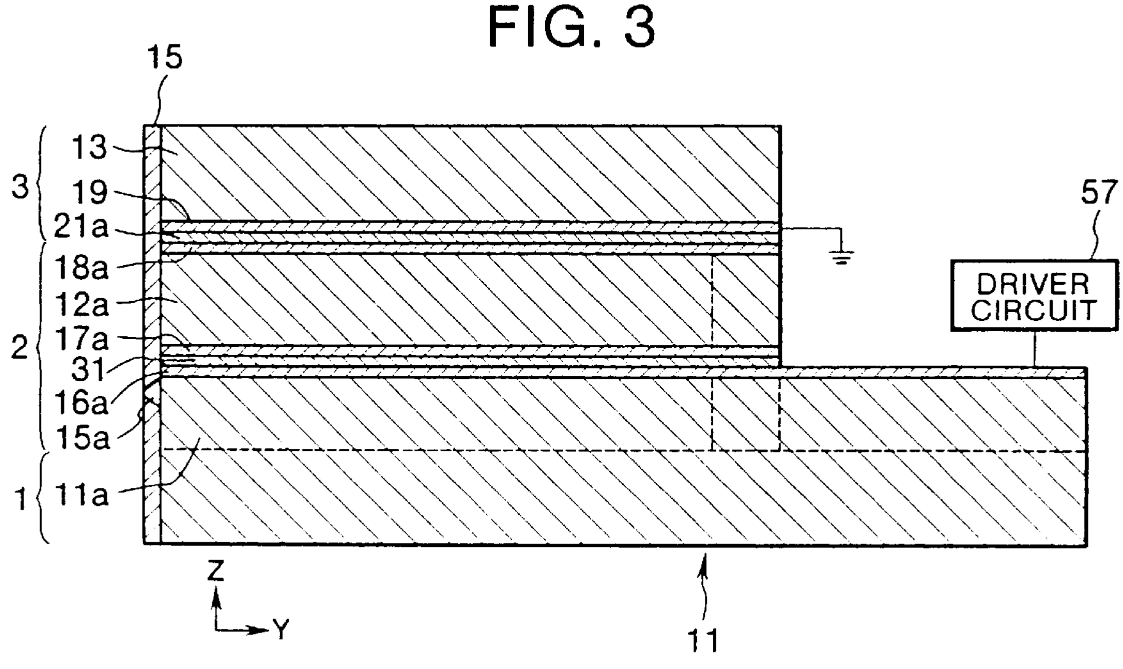
FIG. 3 is a cross-sectional view taken along the line III—III of FIG. 2.

FIG. 2 shows a cross-sectional view of a main part of an ink-jet head according to a first embodiment of the present invention, and FIG. 3 shows a cross-sectional view taken along the line III—III of FIG. 2.

Referring to FIG. 2 and FIG. 3, the ink-jet head of the first embodiment comprises a plurality of ink pressurizing cells or channels 14*a*, 14*b*, . . . defined by a bottom part 1, sidewalls 2, a top part 3 and a front wall 15 having a plurality of orifices 15*a*, 15*b*, . . .

The bottom part 1 is formed from a lower part of a piezoelectric material base 11 polarized in an array direction P (X-axis direction) extending along a row of ink pressurizing cells 14*a*, 14*b*, . . . In FIG. 2, the piezoelectric material base 11 is comb-shaped.

Each sidewall 2 comprises a projecting wall section 11*a* (or 11*b*, . . . ) which is composed of an upper part of a piezoelectric material base 11, and an intermediate wall section 12*a*(or 12*b*, . . . ) made from piezoelectric material polarized in the same array direction P as that of the piezoelectric material base 11 and disposed on the projecting wall section 11*a*(or 11*b*, . . . ).

Electrode 16*a*, 16*b*, . . . are respectively disposed on upper surfaces of the projecting wall sections 11*a*, 11*b*, . . . Width $L_1$ of each electrode 16*a*, 16*b*, . . . is narrower than width $L_2$of each wall section 11*a*, 11*b*, . . . , and the upper surfaces of the projecting wall sections 11*a*, 11*b*, . . . have first side areas $E_1$ which are not covered by the electrodes 16*a*, 16*b*, . . .

Electrodes 17*a*, 17*b*, . . . are respectively disposed on lower surfaces of the intermediate wall sections 12*a*, 12*b*, . . . Width $L_1$of each electrode 17*a*, 17*b*, . . . is narrower than width $L_2$ of each intermediate wall section 12*a*, 12*b*, . . . , and the lower surfaces of the intermediate wall sections 12*a*, 12*b*, . . . have second side areas $E_2$ which are not covered by the electrodes 17*a*, 17*b*, . . .

Anisotropic adhesives 31 are respectively disposed on the electrodes 16*a*, 16*b*, . . . and the first side areas $E_1$ of the projecting wall sections 11*a*, 11*b*, . . . The anisotropic adhesives 31 are conductive only in a direction (Z-axis direction) perpendicular to the upper surfaces of the projecting wall sections 11*a*, 11*b*, . . . and the lower surfaces of the second wall sections 12*a*, 12*b*, . . . , and not conductive in X-axis and Y-axis directions (horizontal directions). The anisotropic adhesives 31 cover the electrodes 16*a*, 16*b*, 17*a*, 17*b* so that the electrodes 16*a*, 16*b*, 17*a*, 17*b* are not exposed to the ink in the ink pressurizing cells 14*a*, 14*b*, . . . by closing parts 31*a* and 31*b*. The anisotropic adhesive 31 is, for example, an anisotropic epoxy adhesive.

Electrodes 18*a*, 18*b*, . . . are disposed on upper surfaces of the intermediate wall sections 12*a*, 12*b*, . . .

The top part 3 comprises a top plate 13 and a common electrode 19 formed on a lower surface of the top plate 13. Conductive adhesives 21*a*, 21*b*, . . . are disposed between the common electrode 19 and the electrodes 18*a*, 18*b*, . . . of the intermediate wall sections 12*a*, 12*b*, . . . The top plate 13 is secured to the intermediate wall sections 12*a*, 12*b*, . . . by the electrode adhesive 21*a*, 21*b*, . . .

Figure 1:
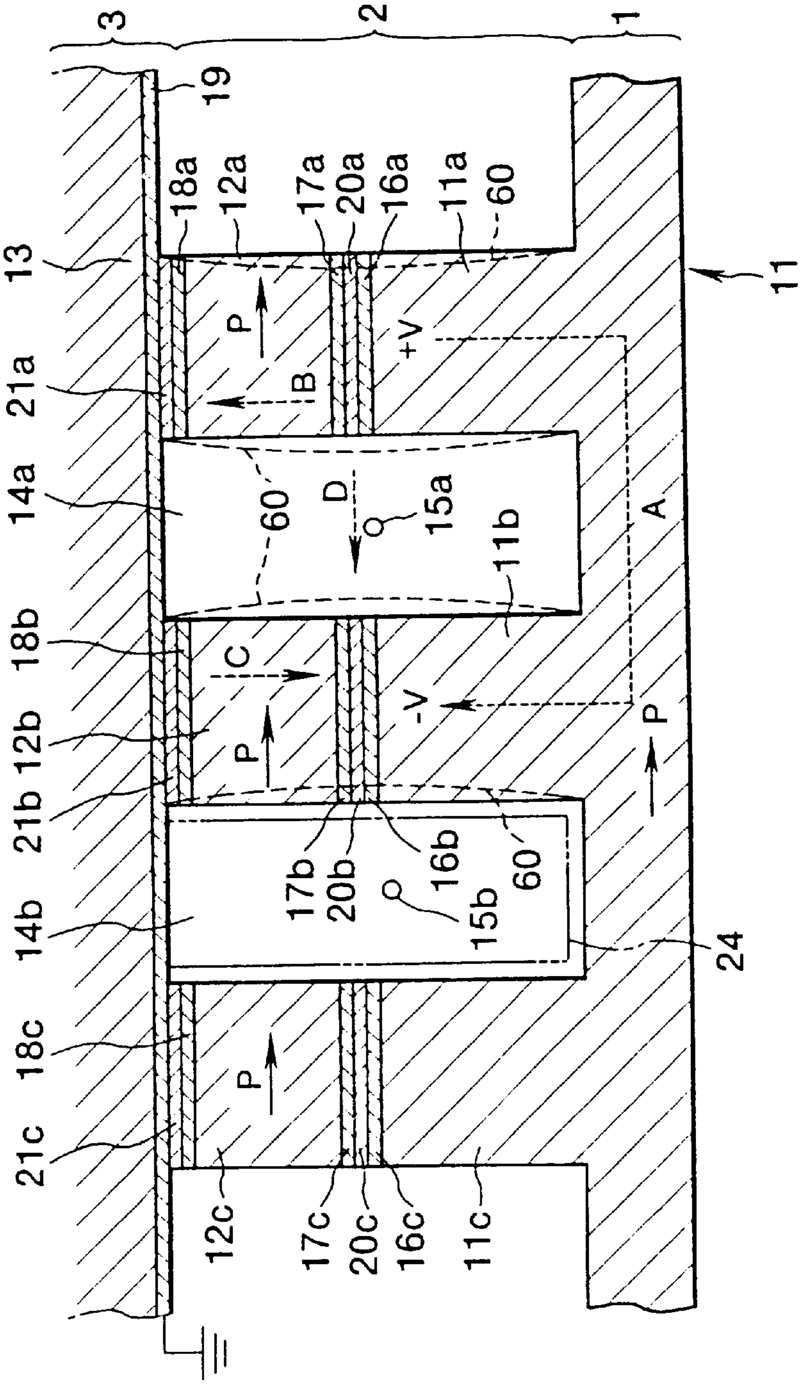
FIG. 1 PRIOR ART
FIG. 1 is a cross-sectional view showing an essential part of a conventional ink-jet head.

When the common electrode 19 is grounded, a positive voltage +V is applied to the electrode 16*a* and a negative voltage −V is applied to the electrode 16*b* by a driver circuit 57, an electric field is generated through the piezoelectric element base 11 from the projecting wall section 11*a* to the projecting wall section 11*b* in the direction shown by a broken line A. Also, an electric field is generated in the intermediate wall section 12*a* from the electrode 17*a* toward the common electrode 19 in the direction shown by a broken line B. Also, an electric field is generated in the intermediate wall section 12*b* from the common electrode 19 toward the electrode 17*b* in the direction shown by a broken line C. As a result, shear mode deformation (shown by broken lines 60 in FIG. 1) is generated in respectively opposite directions in the projecting wall sections 11*a*, 11*b* and the intermediate wall section 12*a*, 12*b*. The ink in the ink pressurizing cell 14*a* is then pressurized, and ink droplets are ejected from the orifice 15*a*.

Since the anisotropic adhesive 31 is not conductive in X-axis direction, the ink pressurizing cell 14*a* is electrically insulated from the electrodes 16*a*, 16*b* and 17*a*, 17*b*. Consequently, leak current flow in the ink pressurizing cells 14*a*, 14*b*, . . . can be decreased.

Also, as indicated by the double dotted chain line in FIG. 2, an insulated coating layer 33 for covering the interior of the ink pressurizing cells 14*a*, 14*b*, . . . may be provided. In this case, insulating performance is increased.

A manufacturing process of the ink-jet head of FIG. 2 will be described below. FIGS. 4A–4E are cross-sectional views showing the manufacturing process of the ink-jet head of FIG. 2, and FIGS. 5A and 5B are plan views each corresponding to FIGS. 4A and 4B.

Figure 4A:
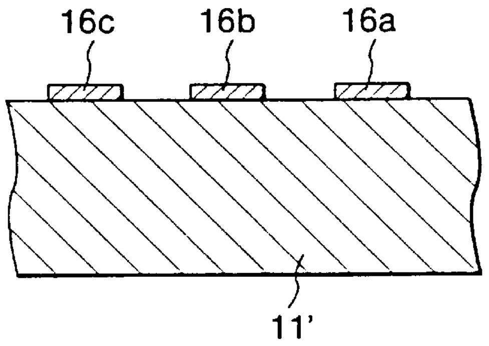
FIGS. 4A–4E are cross-sectional views showing the manufacturing process of the ink-jet head of FIG. 2.
Figure 5A:
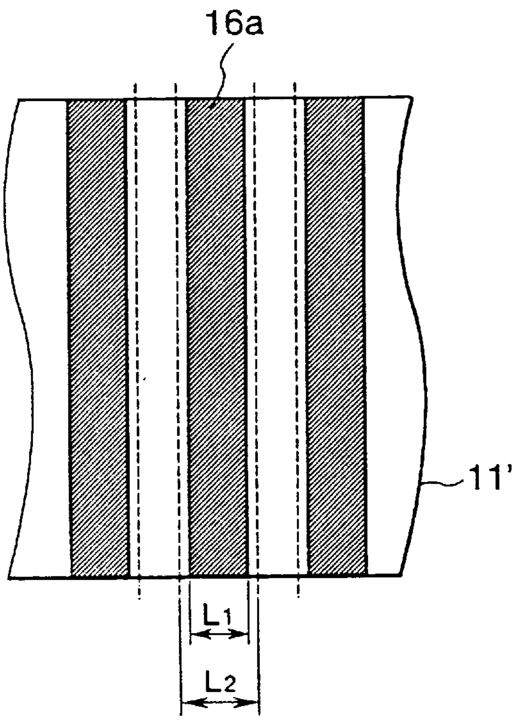
FIGS. 5A and 5B are plan views showing the manufacturing process corresponding to FIGS. 4A and 4B.

First, as shown in FIG. 4A and FIG. 5A, a piezoelectric material plate 11' is prepared, and a thin metal film is formed on the upper surface of the piezoelectric material plate 11' by a thin film method. The thin metal film is etched so that a plurality of stripe patterns of first electrodes 16*a*, 16*b*, . . . are formed on an upper surface of the first piezoelectric material plate 11'. As shown in FIG. 5A, width $L_1$ of each first electrode 16*a*, 16*b*, . . . is in the range of 60 to 75 [$\mu$m].

Figure 4D:
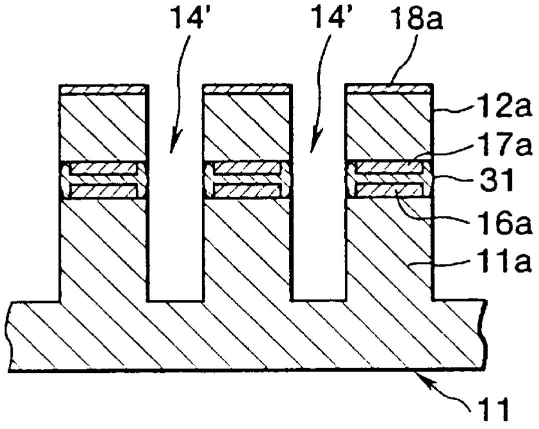
Figure 4B:
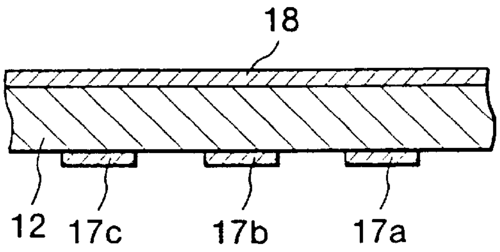
Figure 5B:
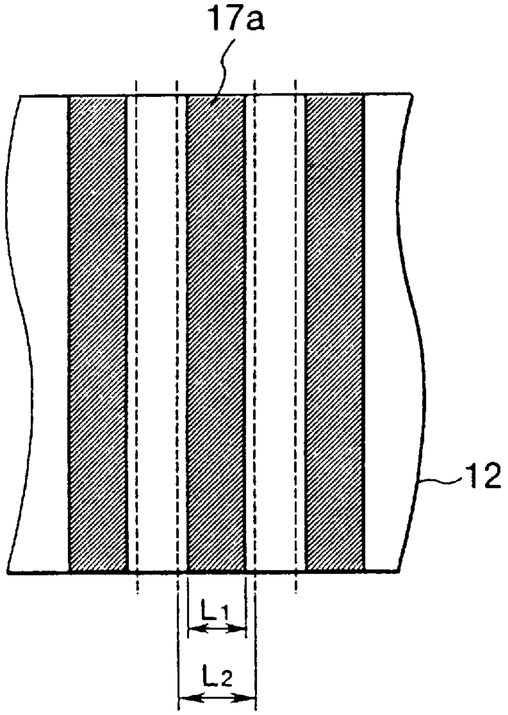

Next, as shown in FIG. 4B and FIG. 5B, another piezoelectric material plate 12 is prepared, and a thin metal films are formed on both surfaces of the piezoelectric material plate 12 by a thin film method. The thin metal film on the lower surface of the piezoelectric material plate 12 is etched so that a plurality of stripe patterns of the second electrodes 17*a*, 17*b*, . . . are formed on the lower surface of the piezoelectric material plate 12. As shown in FIG. 5B, width $L_1$ of each second electrode 17*a*, 17*b*, . . . is in the range of 60 to 70 [$\mu$m].

Next, an anisotropic adhesive 31 is applied to at least one of the upper surface of the first electrodes 16*a*, 16*b*, . . . and the lower surface of the second electrodes 17*a*, 17, . . . The anisotropic adhesive 31 has conductivity only in a direction perpendicular to the upper surfaces of the first electrodes 16*a*, 16*b*, . . . and the lower surfaces of the second electrodes 17*a*, 17*b*, . . . Next, as shown in FIG. 4C, the piezoelectric material plate 12 is placed on the piezoelectric material plate 11' so that the first electrodes 16*a,* 16*b,* . . . and the second electrodes 17*a,* 17*b,* . . . face each other across the anisotropic adhesive 31. Pressure is applied to the piezoelectric material plate 11' and the second piezoelectric material plate 12, thereby filling the portions between the piezoelectric material plate 11' and the piezoelectric material plate 12 not occupied by the electrodes 16*a,* 16*b* and 17*a,* 17*b* with the anisotropic adhesive 31.

Next, as shown in FIG. 4D, a plurality of grooves 14' are formed between the second electrodes 17*a* and 17*b* as well as between the first electrode 16*a* and 16*b*. The grooves 14' penetrate through the third electrode 18, the piezoelectric material plate 12 and the anisotropic adhesive 31, and reach a middle of the piezoelectric material plate 11', thereby forming a comb-shaped piezoelectric material base 11. As a result of forming grooves 14' by cutting, the closing parts 31*a* and 31*b* are formed at the respective side edges of the electrodes 16*a,* 16*b* and 17*a,* 17*b* to separate the electrodes 16*a,* 16*b* and 17*a,* 17*b* from the ink pressurizing cell 14*a,* 14*b*.

Figure 4E:
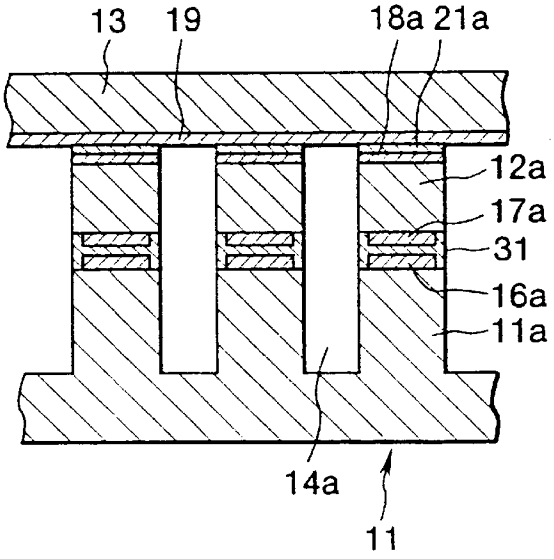
Figure 4C:
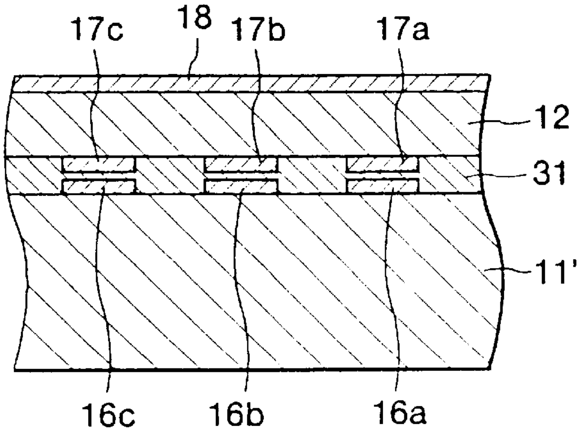

Next, as shown in FIG. 4E, conductive adhesives 21*a,* 21*b,* . . . are applied to an upper surface of the third electrodes 18*a,* 18*b,* . . . and a top plate 13 having a common electrode 19 is placed on the conductive adhesive 21*a,* 21*b,* . . . in such a way that the common electrode 19 faces the third electrode 18*a,* 18*b* . . . across the conductive adhesives 21*a,* 21*b,* . . .

Since the anisotropic adhesive 31 is conductive in the bonding direction (Z-axis direction and reverse direction), the electrodes can be mutually connected electrically. In this case, since the electrode patterns are formed by either a thick film method or a thin film method not based on patterning, cost can be reduced.

Another manufacturing process of the ink-jet head of FIG. 2 will be described below. FIGS. 6A–6E are cross-sectional views showing the manufacturing process of the ink-jet head of FIG. 2, and FIGS. 7A and 7B are plan views each corresponding to FIGS. 6A and 6B.

Figure 6A:
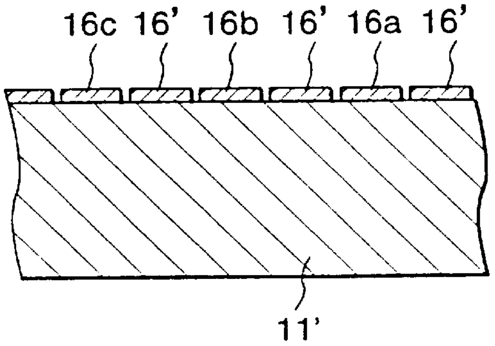
FIGS. 6A–6E are cross-sectional views showing another manufacturing process of the ink-jet head of FIG. 2.
Figure 7A:
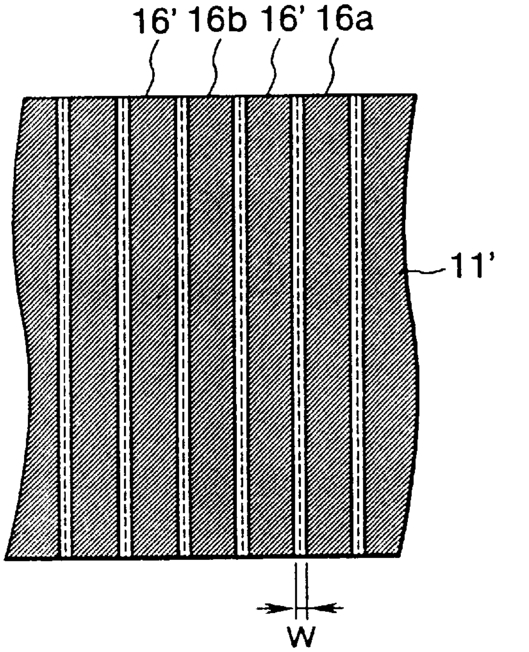
FIGS. 7A and 7B are plan views showing the manufacturing process corresponding to FIGS. 6A and 6B.

First, as shown in FIG. 6A and FIG. 7A, a piezoelectric material plate 11' is prepared, and a metal film is formed on the upper surface of the piezoelectric material plate 11' by either a thick film method such as silkscreen method or a thin film method not based on patterning such as plating. The metal film is etched by for example an excimer leaser so that a plurality of stripe patterns of electrodes 16*a,* 16*b* and 16' are formed on an upper surface of the piezoelectric material plate 11'. In FIG. 7A, width W between the electrode 16*a* and 16' is in the range of 10 to 20 [$\mu$m].

Figure 6D:
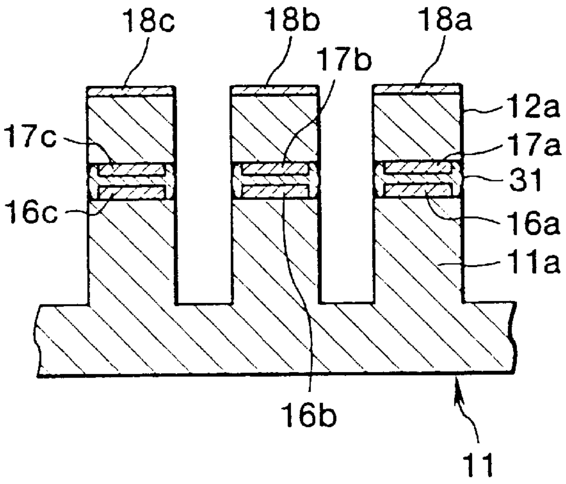
Figure 6B:
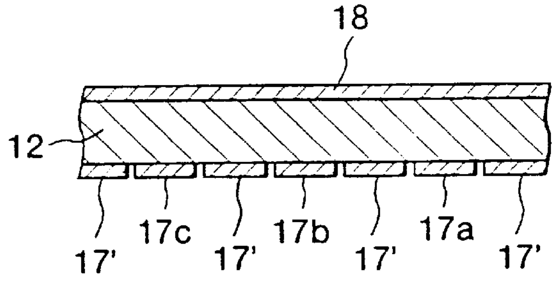
Figure 7B:
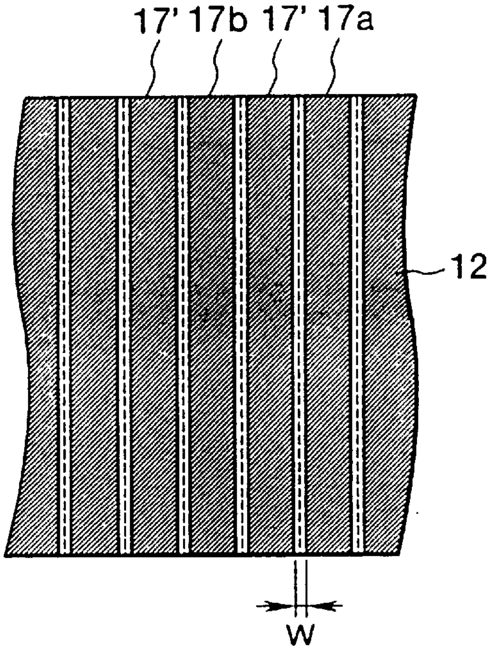

Next, as shown in FIG. 6B and FIG. 7B, another piezoelectric material plate 12 is prepared, and a metal films are formed on both surfaces of the piezoelectric material plate 12 by either a thick film method such as silkscreen method or a thin film method not based on patterning such as plating. The metal film on the lower surface of the piezoelectric material plate 12 is etched by for example an excimer laser so that a plurality of stripe patterns of the second electrodes 17*a,* 17*b,* . . . are formed on the lower surface of the second piezoelectric material plate 12. A shown in FIG. 7B, width W between the electrodes 17*a* and 17' is in the range of 10 to 20 [$\mu$m].

Next, an anisotropic adhesive 31 is applied to at least one of the upper surface of the first electrodes 16*a,* 16*b,* . . . and the lower surface of the second electrodes 17*a,* 17*b,* . . . The anisotropic adhesive 31 has conductivity only in a direction perpendicular to the upper surfaces of the first electrodes 16*a,* 16*b,* . . . and the lower surfaces of the second electrodes 17*a,* 17*b,* . . . Next, as shown in FIG. 6C, the piezoelectric material plate 12 is placed on the piezoelectric material plate 11' so that the first electrodes 16*a,* 16*b,* . . . and the second electrodes 17*a,* 17*b,* . . . face each other across the anisotropic adhesive 31.

Next, as shown in FIG. 6D, a plurality of grooves 14' are formed in such a way that the grooves 14' penetrate through the third electrode 18, the second piezoelectric material plate 12, the every other second electrodes 17', the anisotropic adhesive 31 and the every other first electrodes 16', and reach a middle of the first piezoelectric material plate 11', thereby forming a comb-shaped piezoelectric material base 11. As a result of forming grooves 14' by cutting, the closing parts 31*a* and 31*b* are formed at the respective side edges of the electrodes 16*a,* 16*b* and 17*a,* 17*b* to separate the electrodes 16*a,* 16*b* and 17*a,* 17*b* from the ink pressurizing cells 14*a,* 14*b*.

Figure 6E:
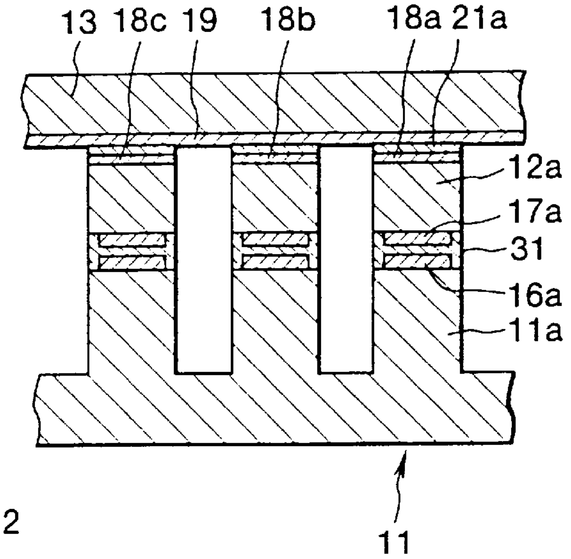
Figure 6C:
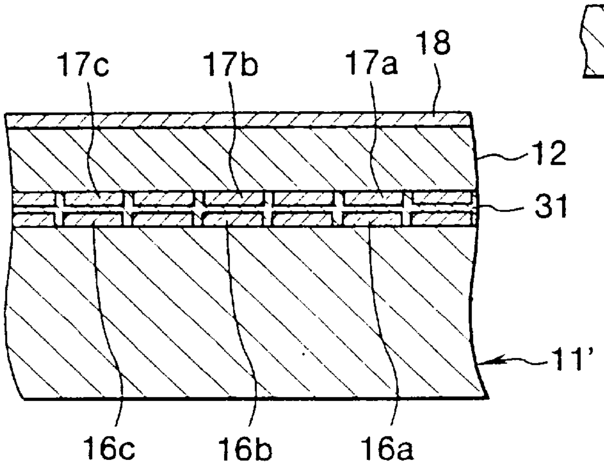

Next, as shown in FIG. 6E, a conductive adhesive 21*a,* 21*b,* . . . is applied to an upper surface of the third electrodes 18*a,* 18*b,* . . . , and a top plate 13 having a common electrode 19 is placed on the conductive adhesives 21*a,* 21*b,* . . . in such a way that the common electrode 19 faces the third electrodes 18*a,* 18*b,* . . . across the conductive adhesives 21*a,* 21*b,* . . .

In this case, since the electrode patterns are formed by either a thick film method or a thin film method not based on patterning, cost can be reduced.

Second Embodiment

Figure 8:
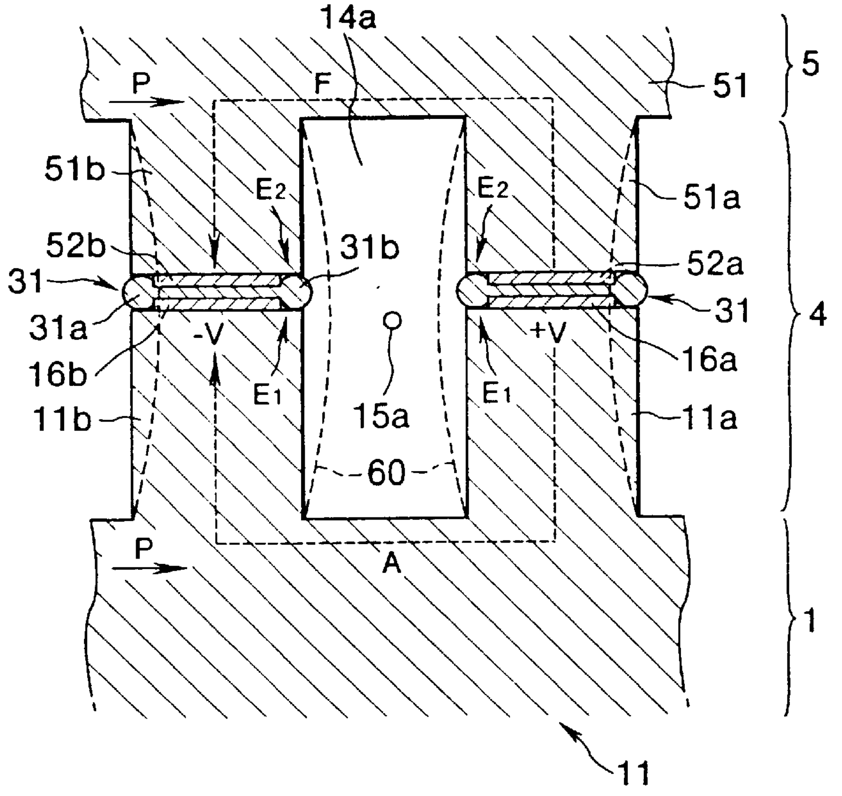
FIG. 8 is a cross-sectional view showing an essential part of an ink-jet head according to a second embodiment of the present invention.

FIG. 8 is a cross-sectional view showing a main part of an ink-jet head according to a second embodiment of the present invention.

Referring to FIG. 8, the ink-jet head of the second embodiment comprises a plurality of ink pressurizing cells 14*a,* 14*b* defined by a bottom part 1, sidewalls 4, a top part 5 and a front wall 15 having a plurality of orifices 15*a,* 15*b,* . . .

The bottom part 1 is formed from a lower part of a piezoelectric material base 11 polarized in an array direction P (X-axis direction) extending along a row of ink pressurizing cells 14*a,* 14*b,* . . . In FIG. 8, the piezoelectric material base 11 is comb-shaped.

The top part 5 is formed from an upper part of a piezoelectric material plate 51 polarized in an array direction P (X-axis direction extending along a row of ink pressurizing cells 14*a,* 14*b*. In FIG. 8, the piezoelectric material base 51 is comb-shaped.

Each sidewall 4 comprises a projecting wall section 11*a* (or 11*b,* . . . ) which is composed of an upper part of the piezoelectric material base 11, and a projecting wall sections 51*a* (or 51*b,* . . . ) which is composed of a lower part of the piezoelectric material base 51.

Electrode 16*a,* 16*b,* . . . are respectively disposed on an upper surfaces of the projecting wall sections 11*a,* 11*b,* . . . Width $L_1$ of each 16*a,* 16*b,* . . . is narrower than width $L_2$ of each wall section 11*a,* 11*b,* . . . , and the upper surfaces of the projecting wall sections 11*a,* 11*b,* . . . have first side areas $E_1$ which are not covered by the electrodes 16*a,* 16*b,* . . .

Electrodes 52*a,* 52*b,* . . . are respectively disposed on a lower surface of the projecting wall sections 51*a,* 51*b,* . . . Width $L_1$ of each electrode 52*a,* 52*b,* . . . is narrower than width $L_2$ of each wall section 51*a,* 51*b,* . . . , and the lower surfaces of the projecting wall sections 51*a,* 51*b,* . . . have second side areas $E_2$ which are not covered by the electrodes 52*a,* 52*b,* . . .

Anisotropic adhesives 31 are respectively disposed on the electrodes 16*a,* 16*b,* . . . and the first side areas $E_1$ of the projecting wall sections 11*a,* 11*b,* . . . The anisotropic adhesive 31 is conductive only in a direction (Z-axis direction or reverse direction) perpendicular to the upper surfaces of the projecting wall sections 11*a,* 11*b,* . . . and the lower surfaces of the projecting wall sections 51*a,* 51*b,* . . . , and not conductive in X-axis and Y-axis directions (horizontal directions). The anisotropic adhesives 31 cover the electrodes 16*a,* 16*b,* 17*a,* 17*b* so that the electrodes 16*a,* 16*b,* 17*a,* 17*b* are not exposed to the ink in the ink pressurizing cells 14*a,* 14*b,* . . . by the closing parts 31*a* and 31*b*.

When a positive voltage +V is applied to the electrode 16*a* and a negative voltage −V is applied to the neighboring electrode 16*b,* an electric field is generated through the piezoelectric element base 11 from the projecting wall section 11*a* to the projecting wall section 11*b* in the direction shown by a broken line A. Also, an electric field is generated through the piezoelectric element base 51 from the projecting wall section 51*a* to the projecting wall section 51*b* in the direction shown by a broken line F. As a result, shear mode deformation (shown by broken lines 60) is generated in respectively opposite directions in the projecting wall sections 11*a,* 11*b* and the projecting wall section 51*a,* 51*b*. The ink in the ink pressurizing cell 14*a* is then pressurized, and ink droplets are ejected from the orifice 15*a*.

Since the anisotropic adhesive 31 is not conductive in X-axis direction, the ink pressurizing cell 14*a* is electrically insulated from the electrodes 16*a,* 16*b* and 52*a,* 52*b*. Consequently, leak current flow in the ink pressurizing cell 14*a* can be decreased.

Also, an insulated coating layer for covering the interior of the ink pressurizing cells may be provided. In this case, insulating performance is increased.

Third Embodiment

Figure 9:
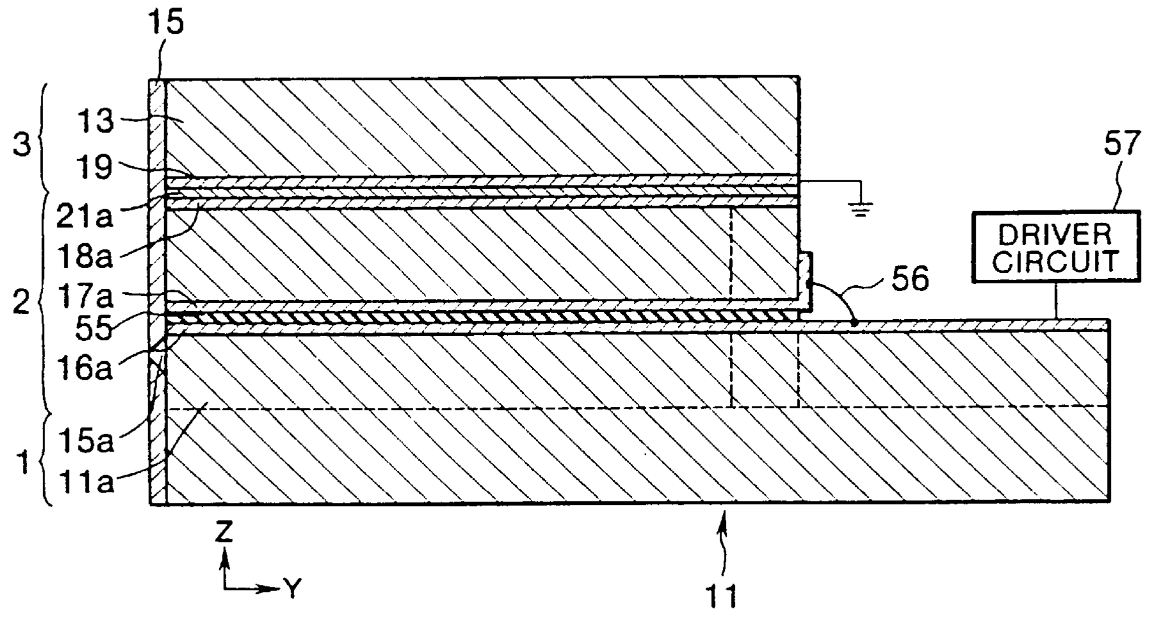
FIG. 9 is a cross-sectional view showing an ink-jet head according to a third embodiment of the present invention.

FIG. 9 is a cross-sectional view showing the ink-jet head according to a third embodiment of the present invention. The ink-jet head of the third embodiment has the same construction as those of the first embodiment shown in FIG. 2 and FIG. 3, except that the projecting wall sections 11*a,* 11*b,* . . . and the intermediate wall sections 12*a,* 12*b,* . . . are not bonded by the anisotropic adhesive 55 but an insulating adhesive 55 as well as the first electrodes 16*a,* 16*b,* . . . and the second electrodes 17*a,* 17*b,* . . . mutually opposing are connected by conductive wires 56 outside the ink pressurizing cells 14*a,* 14*b,* . . .

In the case of the third embodiment, since anisotropic adhesive is not used, the ink-jet head manufacturing cost can be further reduced.

Since the electrodes 16*a,* 16*b,* 17*a,* 17*b* are insulated from the ink in the ink pressurizing cells 14*a,* 14*b,* . . . by the insulating adhesive 55, leak current flow in the ink pressurizing cells 14*a,* 14*b,* . . . can be prevented. Consequently, since the ink pressurization amount in the ink pressurizing cells from shear mode deformation is not reduced, an adequate amount of ink droplets can be emitted from the orifices.

A manufacturing method of the ink-jet head of FIG. 9 is the same as that of the first embodiment shown in FIGS. 4A–4E, FIGS. 5A and 5B, or FIGS. 6A–6E, FIGS. 7A and 7B, except that the anisotropic adhesive 31 is replaced by the insulating adhesive 55 and the step for electrically connecting the electrodes 16*a,* 16*b,* . . . and the second electrodes 17*a,* 17*b,* . . . mutually opposing by conductive wires is added.

The present invention is not limited by the above described embodiments and numerous variations are possible within the scope of the present invention. For example, the anisotropic adhesive 31 of FIG. 8 may be replaced by the insulating adhesive 55 of FIG. 9 by adding the conductive wires 56 of FIG. 9. Moreover, in the above embodiments, a voltage may not be applied to the electrode 16*a,* 16*b,* . . . , but the electrode 17*a,* 17*b,* . . . by the driver circuit 57.

What is claimed is:

1. A manufacturing method of an ink-jet head comprising the steps of:

forming a plurality of stripe patterns of first electrodes at predetermined intervals on an upper surface of a first piezoelectric material plate;

forming a plurality of strip-shaped second electrodes at predetermined intervals on a lower surface of a second piezoelectric material plate;

forming a third electrode on an upper surface of said second piezoelectric material plate;

applying an anisotropic adhesive to at least one of said upper surface of said first electrodes and said lower surface of said second electrodes, said anisotropic adhesive having conductivity only in a direction perpendicular to said upper surfaces of said first electrodes and said lower surfaces of said second electrodes;

placing said first piezoelectric material plate on said second piezoelectric material plate in such a way that said first electrodes and said second electrodes face each other across said anisotropic adhesive;

cutting a plurality of grooves between said first electrodes as well as between said second electrodes to form a plurality of sidewalls in such a way that said groove penetrate through said third electrode, said second piezoelectric material plate and said anisotropic adhesive and reach a middle of said first piezoelectric material plate and in such a way that width of said first electrode and said second electrode are narrower than width of said sidewall and said first and second electrodes are covered by said anisotropic adhesive not so as to be exposed to the ink in said ink pressurizing cells;

applying a conductive adhesive to an upper surface of said third electrode; and placing a top plate having a common electrode on said conductive adhesive in such a way that said common electrode faces said third electrode across said conductive adhesive.

2. A manufacturing method of an ink-jet head comprising the steps of:

forming a plurality of stripe patterns of first electrodes at predetermined intervals on an upper surface of a first piezoelectric material plate;

forming a plurality of stripe patterns of second electrodes at predetermined intervals on a lower surface of a second piezoelectric material plate;

forming a third electrode on an upper surface of said second piezoelectric material plate;

applying an insulating adhesive to at least one of said upper surface of said first electrodes and said lower surface of said second electrodes;

placing said first piezoelectric material plate on said second piezoelectric material plate in such a way that said first electrodes and said second electrodes face each other across said insulating adhesive;

cutting a plurality of grooves between said first electrodes as well as between said second electrodes to form a plurality of sidewalls in such a way that said grooves penetrate through said third electrode, said second piezoelectric material plate and said insulating adhesive and reach a middle of said first piezoelectric material plate and in such a way that width of said first electrode and said second electrode are narrower than width of said sidewall and said first and second electrodes are covered by said insulating adhesive not so as to exposed to the ink in said ink pressurizing cells;

applying a conductive adhesive to an upper surface of said third electrode;

placing a top plate having a common electrode on said conductive adhesive in such a way that said common electrode faces said third electrode across said conductive adhesive; and electrically connecting said first electrodes and said second electrodes in the same sidewall by conductive wires.

3. A manufacturing method of an ink-jet head comprising the steps of:

forming a plurality of stripe patterns of first electrodes at predetermined intervals on an upper surface of a first piezoelectric material plate;

forming a plurality of stripe patterns of electrodes at predetermined intervals on a lower surface of a second piezoelectric material plate;

forming a third electrode on an upper surface of said second piezoelectric material plate;

applying an anisotropic adhesive to at least one of said upper surface of said first electrodes and said lower surface of said second electrodes, said anisotropic adhesive having conductivity only in a direction perpendicular to said upper surfaces of said first electrodes and said lower surfaces of said second electrodes;

placing said first piezoelectric material plate on said second piezoelectric material plate in such a way that said first electrodes and said second electrodes face each other across said anisotropic adhesive;

cutting a plurality of grooves to form a plurality of sidewalls in such a way that said grooves penetrate through said third electrode, said second piezoelectric material plate, said every other second electrodes, said anisotropic adhesive and said every other first electrodes, and reach a middle of said first piezoelectric material plate and in such a way that width of said first electrode and said second electrode are narrower than width of said sidewall and said first and second electrodes are covered by said anisotropic adhesive not so as to be exposed to the ink in said ink pressurizing cells;

applying a conductive adhesive to an upper surface of said third electrode; and placing a top plate having a common electrode on said conductive adhesive in such a way that said common electrode faces said third electrode across said conductive adhesive.

4. A manufacturing method of an ink-jet head comprising the steps of:

forming a plurality of stripe-shaped first electrodes at predetermined intervals on an upper surface of a first piezoelectric material plate;

forming a plurality of strip-shaped second electrodes at predetermined intervals on a lower surface of a second piezoelectric material plate;

forming a third electrode on an upper surface of said second piezoelectric material plate;

applying an insulating adhesive to at least one of said upper surface of said first electrodes and said lower surface of said second electrodes;

placing said first piezoelectric material plate on said second piezoelectric material plate in such a way that said first electrodes and said second electrodes face each other across said insulating adhesive;

cutting a plurality of grooves to form a plurality of sidewalls in such a way that said grooves penetrate through said third electrode, said second piezoelectric material plate, said every other second electrodes, said insulating adhesive and said every other first electrodes, and reach a middle of said first piezoelectric material plate and in such a way that width of said first electrode and said second electrode are narrower than width of said sidewall and said first and second electrodes are covered by said insulating adhesive not so as to exposed to the ink in said ink pressurizing cells;

applying a conductive adhesive to an upper surface of said third electrode;

placing a top plate having a common electrode on said conductive adhesive in such a way that said common electrode faces said third electrode across said conductive adhesive; and electrically connecting said first electrodes and said second electrodes in the same sidewall by conductive wires.

* * * * *